US007944298B2

(12) United States Patent
Cabanillas et al.

(10) Patent No.: US 7,944,298 B2
(45) Date of Patent: May 17, 2011

(54) LOW NOISE AND LOW INPUT CAPACITANCE DIFFERENTIAL MDS LNA

(75) Inventors: Jose Cabanillas, San Diego, CA (US); Prasad S. Gudem, San Diego, CA (US); Namsoo Kim, San Diego, CA (US); Cristian Marcu, Windsor, CA (US); Anup Savla, San Mateo, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 11/959,196

(22) Filed: Dec. 18, 2007

(65) Prior Publication Data
US 2009/0153244 A1 Jun. 18, 2009

(51) Int. Cl.
H03F 3/45 (2006.01)
(52) U.S. Cl. ......................................... 330/253; 330/283
(58) Field of Classification Search .......... 330/252–261, 330/283
See application file for complete search history.

(56) References Cited

U.S. PATENT DOCUMENTS

| 7,432,763 | B2* | 10/2008 | Leete | 330/254 |
| 7,746,169 | B2* | 6/2010 | Deng et al. | 330/254 |
| 2005/0176399 | A1 | 8/2005 | Aparin | |
| 2007/0229154 | A1 | 10/2007 | Kim et al. | |

OTHER PUBLICATIONS

International Search Report—PCT/US2008/086950—International Search Authority EPO—Mar. 30, 2009.

Aparin, V., et al.: "Modified derivative superposition method for linearizing FET low-noise amplifiers," IEEE Transaction on Microwave Theory and Techniques, IEEE Service Center, Piscataway, NJ, US, vol. 53, No. 2, Feb. 1, 2005, pp. 571-581
Cho, K-R., et al.,"A novel CMOS operational transconductance amplifier based on a mobility compensation technique," IEEE Transactions on Circuits and Systems II: Express Briefs, IEEE Service Center, New York, NY, US, vol. 52, No. 1, Jan. 1, 2005, pp. 37-42, ISSN: 1057-7130.
Kim, T-S., et al.: "Linearization of differential CMOS low noise amplifier using cross-coupled post distortion canceller," Radio Frequency Integrated Circuits Symposium, 2008. RFIC 2008, IEEE, Piscataway, NJ, US, Jun. 17, 2008, pp. 83-86, ISBN: 978-1-4244-1808-4.
Written Opinion—PCT/US2008/086950—International Search Authority—European Patent Office—Mar. 30, 2009.

* cited by examiner

Primary Examiner — Robert Pascal
Assistant Examiner — Khiem D Nguyen
(74) Attorney, Agent, or Firm — Larry J. Moskowitz; William M. Hooks

(57) ABSTRACT

A differential low noise amplifier (LNA) involves two main amplifying transistors biased in saturation, and two cancel transistors biased in sub-threshold. In one example, the gates of the cancel transistors are coupled to the drains of main transistors, in a symmetrical and cross-coupled fashion. The main transistors are source degenerated. Because the gates of cancel transistors are not coupled to the differential input leads of the LNA, the input capacitance of the LNA is reduced. Noise introduced into the LNA output due to the cancel transistors being biased in the sub-threshold region is reduced because there are two stages. The first stage involves the main transistors, and the second stage involves the cancel transistors. By increasing the gain of the first stage and decreasing the gain of the second stage, overall LNA gain is maintained while reducing the noise that the sub-threshold biased transistors contribute to the LNA output.

19 Claims, 11 Drawing Sheets

DIFFERENTIAL CROSS-COUPLED MDS LNA

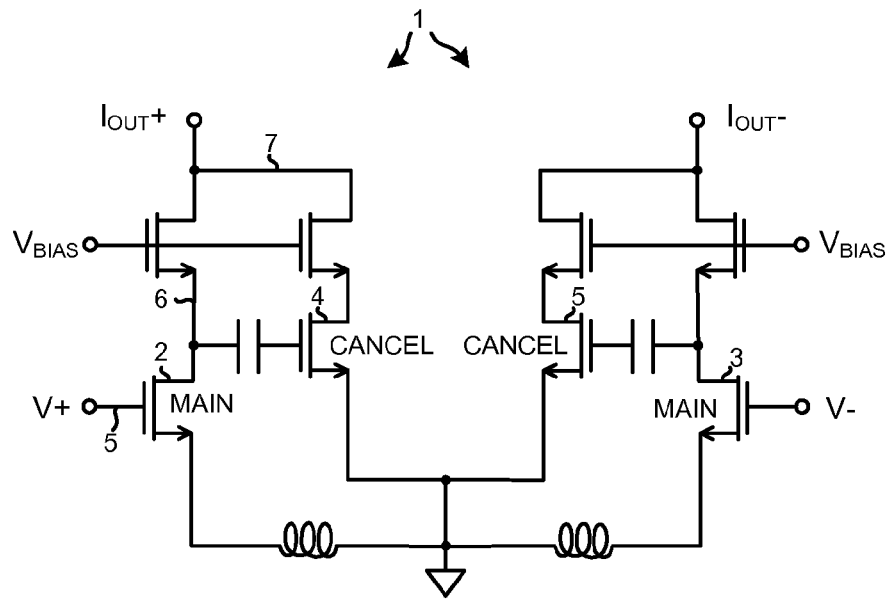
DIFFERENTIAL ACTIVE POST-DISTORTION LNA
(PRIOR ART)
FIG. 1
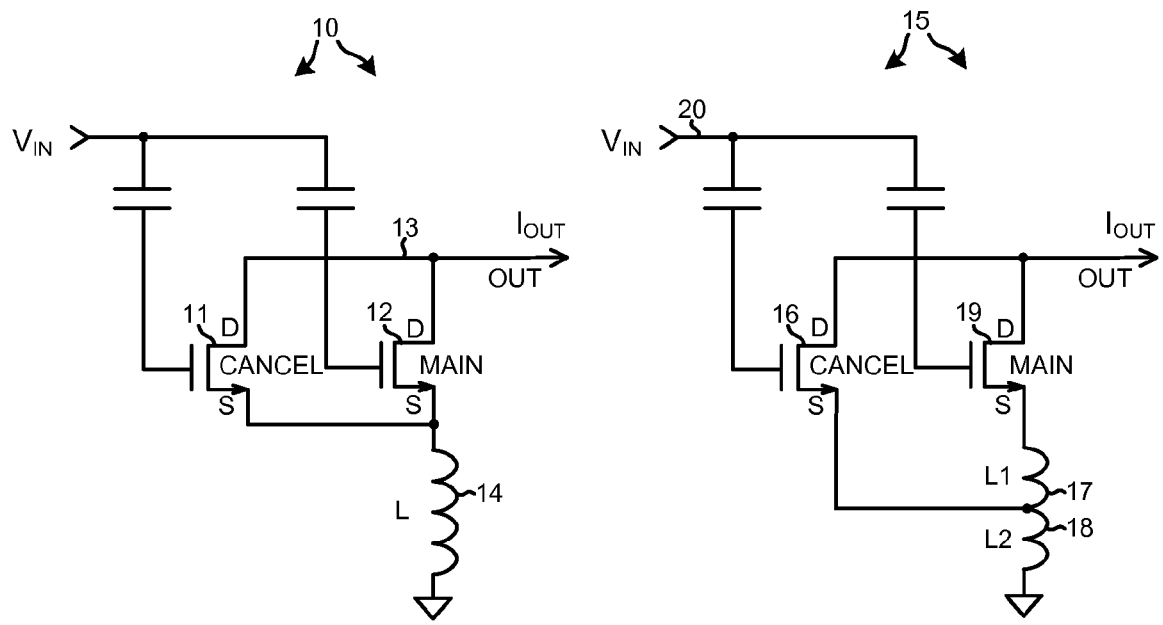
SINGLE-ENDED DS LNA
(PRIOR ART)
FIG. 2
SINGLE-ENDED MDS LNA
(PRIOR ART)
FIG. 3

LOW NOISE AND LOW INPUT CAPACITANCE DIFFERENTIAL MDS LNA

BACKGROUND INFORMATION

1. Technical Field

The disclosed embodiments relate to low noise amplifiers.

2. Background Information

The first amplification stage in a radio receiver such as a receiver of a cellular telephone is generally an amplifier circuit called a Low Noise Amplifier (LNA). The LNA reduces the noise contributions of following stages and sets the lowest achievable noise level of the overall receiver. The LNA is therefore generally designed to have high gain to minimize the amount of noise introduced without introducing unacceptably large amounts of distortion. If a sinusoidal input signal of a pure single frequency is supplied to the input of a linear amplifier, then the amplifier will output an amplified version of the input signal. The output signal will have only a single frequency, and this frequency will be the frequency of the input signal. If, however, the same sinusoidal input signal is supplied to the input of an amplifier that exhibits an amount of non-linearity, then the amplifier will output an amplified version of the input signal at the frequency of the input signal, but the amplifier will also output one or more other signals of other frequencies. These other signals are referred to as "distortion". The interactions between the input signal (or multiple input signals) and the particular non-linearities of the amplifier can be complex, and the type of distortion can also be complex and depends on many different characteristics of the amplifier and the input signal.

More particularly, the transconductance of a non-linear amplifier is sometimes described using an equation of the form below:

$$y = g_o + g_1 x + g_2 x^2 + g_3 x^3 \quad \text{(Equ. 1)}$$

In Equation 1, the x denotes an input signal and the y denotes a resulting output signal. The terms $g_1 x$ and $g_2 x^2$ and $g_3 x^3$ are referred to as the first-order term (or "linear term"), the second-order term, and the third-order term, respectively. If x (the input signal) is a voltage and y (the output signal) is a current, then $g_1$ is referred to as the "linear transconductance coefficient" while the coefficients $g_2$ and $g_3$ are referred to as the second order transconductance coefficient, and the third order transconductance coefficient, respectively.

As output power of an LNA is increased, the magnitude of generated distortion increases faster than does the magnitude of the desired signal. At some output power, the magnitude of distortion is equal to the magnitude of the desired signal. This output power where the magnitude of third order distortion is equal to the output power of the desired signal is referred to as the third-order intercept point IIP3. To a first approximation, IIP3 is given by Equation 2 below if the second order contribution to IIP3 is neglected:

$$IIP3 = \sqrt{(4/3)(g_1/g_3)} \quad \text{(Equ. 2)}$$

The receiver in a cellular telephone may be used to receive a signal in a condition in which there are undesired signals in addition to the desired signal to be received. These undesired signals are called jammers and they can have very different natures. Adjacent channel signals and transmitter signals are just some examples of jammers. Jammers can be discrete tones or can have a given bandwidth. For analysis purposes, a non-discrete signal can be modeled as two sine wave signals, each having a different frequency, where the difference in frequencies of the two sine wave signals is the bandwidth of the non-discrete signal.

Consider a situation in which the desired signal to be received has a frequency of 1 GHz. If a first adjacent channel receive jammer has a frequency $\omega_1$ of 1.001 GHz, and a second adjacent channel receive jammer has a frequency $\omega_2$ of 1.002 GHz, and if the sum of these two jammer signals is supplied as variable x into Equation 1 above, then the resulting y signal will, due to the squaring and cubing of terms, have many components of many frequencies. Due to the third order term and associated cubing of the sum of input signals, there will be one component of the output y that has a frequency of $(2\omega_1 - \omega_2)$. This component is therefore at the same 1 GHz frequency as the desired signal. Because this distortion component and the desired signal have the same 1 GHz frequency, the desired signal cannot be separated from the distortion component by filtering. A receiver that is more linear is therefore desired in order to reduce the magnitude of this distortion component. This distortion component is sometimes referred to as the third order "intermodulation distortion".

In addition, in a cellular telephone that operates in accordance with a Code Division Multiple Access (CDMA) standard such as CDMA2000, the cellular telephone has a transmitter that may be transmitting at the same time that the receiver of the cellular telephone is receiving. Although the transmitted signals are transmitted in a different frequency band than the desired signal that is being received, the transmitted signals can be strong and are output from the cellular telephone transmitter in close proximity to the highly sensitive receiver of the cellular telephone. Accordingly, a substantial amount of the transmitted signals may leak back into the receiver and cause distortion problems. The transmitted signals are transmitted in a band, so they may be modeled as described above as two signals that have different frequencies, where the difference in frequencies of the two signals is the width of the channel.

Then, in addition, there is the signal that is to be received. This signal is referred to as the desired signal. Consider a situation in which the desired signal to be received has a receive frequency $\omega_3$ of 1 GHz. If a first transmit jammer is at a frequency $\omega_1$ of 900.0 MHz, and a second transmit jammer is at a frequency $\omega_2$ of 900.4 MHz, and if the sum of the two jammers signals and the desired signal is supplied as variable x into Equation 1 above, then the resulting y signal will, due to the squaring and cubing of terms, have many components of many frequencies. Due to the third order term and the resulting cubing, it so happens there will be one component of the output y that has a frequency of $\omega_3 - (\omega_2 - \omega_1)$. This frequency in this example is 1.0006 GHz, and is therefore in the one megahertz wide receive band centered at 1 GHz. This component is sometimes referred to as the "triple beat" distortion component, or the third order "cross-modulation" component. Because the cross-modulation component is in the receive band, it typically cannot be separated from the desired signal by filtering. A receiver that is more linear is therefore also desired in order to reduce the magnitude of this cross-modulation distortion component.

In addition to introducing no more than an acceptable amount of distortion, the amplifier should introduce a minimal amount of noise. Thermal noise is due to random motion of electrons and atoms within the resistive component of any impedance such as the resistive component of the semiconductor material of which transistors are made. All amplifiers utilizing transistors therefore introduce noise. This noise is naturally occurring and inherent in the amplifier. The introduction of noise into the output of the LNA cannot be eliminated, but poor design can result in the LNA adding noise more than is necessary and amplifying pre-existing noise more than necessary. The noise output by the LNA then flows through the remainder of the receiver. An LNA is therefore designed to reduce and minimize the amount of noise the LNA outputs.

Several different techniques and circuit topologies are conventionally applied to realize LNAs that exhibit low noise and distortion performance. These techniques include techniques referred to as feed-back cancellation, pre-distortion cancellation, feed-forward cancellation, and post-distortion cancellation. Three specific examples of post-distortion cancellation techniques are of interest here and are referred to as the Active Post-Distortion (APD) technique, the Derivative Super-position (DS) technique, and the Modified Derivative Superposition (MDS) technique.

FIG. 1 (Prior Art) is a circuit diagram of a differential LNA 1 that utilizes the Active Post-Distortion technique. This technique involves the use of four field effect transistors (FETs) biased in the saturation region. FETs 2 and 3 are referred to as the main FETs. FETs 4 and 5 are referred to as the cancel FETs. One pair of main FET and cancel FET operates as follows. Main FET 2 (which defines the gain and noise figure of the circuit) amplifies an input signal on input lead 5. An amplified version of the input signal is generated onto node 6. Because main FET 2 is configured as a common source amplifier, the amplified signal has a phase shift of approximately 180 degrees with respect to the input signal on input lead 5. Third order distortion components are also present in the signal on node 6 along with the desired amplified version of the input signal. The phase-shifted signal on node 6 is applied to the input of cancel FET 4. Cancel FET 4 is biased in the saturation region, but nonetheless is has a significantly non-linear amplifying characteristic. Cancel FET 4 is designed to be a lousy amplifier in that it generates a substantial amount of third order distortion but supplies only a small amount of the desired signal, in amplified form, onto its drain. The magnitude of the distortion signal output by FET 4 is set to be equal in magnitude to the distortion signal output by FET 2 onto node 6. Because cancel FET 4 is biased in the saturation region, both the distortion it outputs as well as the amplified desired signal it outputs are 180 degrees out of phase with respect to the third order distortion components on node 6. The current signals output from main FET 2 and cancel FET 4 are summed at node 7. This summing results in cancellation of the third order distortion in both signals. Unfortunately, besides canceling the unwanted third order distortion, this technique also results in some cancellation of the desired signal because the amplified versions of the desired input signal that are output by FETs 2 and 4 are in phase with each other. The gain of the LNA is therefore degraded. See Published U.S. Patent Application No. 2007/0229154, published Oct. 4, 2007, for further details on the differential LNA of FIG. 1.

FIG. 2 (Prior Art) is a circuit diagram of a single-ended LNA 10 that utilizes the Derivative Super-position (DS) technique. This example is a single ended circuit, as opposed to the differential circuit of the example of FIG. 1. In the DS circuit of FIG. 2, two FETs 11 and 12 are used. FET 12 is referred to as the main FET and it is biased in the saturation region. FET 11 is referred to as cancel FET and it is biased in the sub-threshold region. When the transconductance equation for a FET amplifier biased in the saturation region is compared to the transconductance equation for a FET amplifier biased in the sub-threshold region, it is recognized that the signs of the third order coefficients of the transconductance equations of the two transistors are opposite one another. The signs of the first order coefficients, however, are not opposite one another. This means that biasing a transistor in the sub-threshold region results in a shift in the phase of the third order distortion signal it outputs as compared to a transistor biased in the saturation region, whereas the phase of the desired signal as output by the sub-threshold biased transistor is not phase shifted as compared to the transistor biased in the saturation region. The currents output by FETS 11 and 12 are therefore summed on node 13, resulting in the distortion signal output by the cancel FET 11 canceling the third order distortion output by main FET 12. The signal that cancel FET 11 outputs that is of the frequency of the desired input signal is not, however, 180 degrees out of phase with respect to the amplified version of the desired signal as output by main FET 12, and consequently a portion of the desired signal on node 13 is not cancelled as in the APS example of FIG. 1.

Employing the DS technique of FIG. 2, however, has a problem. The source degeneration inductance 14 creates a feedback path, which allows the second order transconductance coefficient to contribute to the third order distortion. As a result, the DS technique does not significantly increase the third-order intercept point IIP3. In the DS technique, the second order contribution of third order distortion results in an undesirably low IIP3.

FIG. 3 (Prior Art) is a diagram of an LNA 15 employing the Modified Derivative Superposition (MDS) technique. Rather then scaling and rotating the second order transconductance coefficient $g_{2MAIN}$ contribution to third-order intermodulation distortion as in the case of the DS technique, the MDS technique changes the magnitude and phase of the third order transconductance coefficient $g_{3CANCEL}$ contribution to the third order intermodulation distortion relative to third order transconductance coefficient $g_{3MAIN}$ contribution to the third order intermodulation distortion, such that their sum ($g_{3CANCEL}$ and $g_{3MAIN}$ contributions) is out-of-phase with the second order coefficient $g_{2MAIN}$ contribution to the third order intermodulation distortion. A purpose of connecting the source of cancel FET 16 to the common node of the two inductors 17 and 18 is to change the magnitude and phase of the $g_{3CANCEL}$ contribution relative to the $g_{2MAIN}$ and $g_{3MAIN}$ contributions of main FET 19. The MDS LNA 15 of FIG. 3 therefore has an improved IIP3 as compared to the IIP3 of the DS LNA 10 of FIG. 2. It is to be understood that the description of the phase relationships and transistor operations set forth above are simplifications. They are presented here for instructional purposes. See Published U.S. Patent Application No. 2005/0176399, published Aug. 11, 2005, for a more detailed explanation of the operation of an LNA that employs the Modified Derivative Superposition (MDS) technique.

Unfortunately, an amplifier that employs a sub-threshold-biased FET is generally a noisy amplifier as compared to an amplifier that employs a FET that is biased in the saturation region. In the MDS LNA circuit 15 of FIG. 3, cancel FET 16 introduces an undesirable amount of noise into the LNA output. Moreover, the gate of cancel FET 16 is coupled to the input lead 20 of LNA 15, resulting in LNA 15 having an undesirably large input capacitance.

SUMMARY

A differential MDS LNA includes a first transistor and a second transistor that are biased in the saturation region. The first transistor receives a first input signal from a first differential input signal node and generates an amplified version of the first input signal as well as a first distortion signal. The second transistor receives a second input signal from a second differential input signal node and generates an amplified version of the second input signal as well as a second distortion signal. The first and second input signals together are a differential input signal that is supplied as a differential input signal onto the two differential input signal nodes of the differential LNA. The second input signal is therefore approximately 180 degrees out of phase with respect to the first input signal. Because the first and second transistors have similar circuit topologies, the signals as output from the second transistor are approximately 180 degrees out of phase with respect to corresponding signals as output from the first transistor.

The differential MDS LNA also includes a third transistor and a fourth transistor that are biased in the sub-threshold region. The third transistor is coupled to receive the amplified version of the second input signal. In one example, this amplified version of the second input signal is communicated from the drain of the second transistor, through a capacitor, and onto a gate of the third transistor. The third transistor in turn outputs a version of the second input signal as well as a third distortion signal. The third distortion signal is referred to here as the first cancel signal.

The version of the second input signal as output by the third transistor is substantially in phase with the amplified version of the first input signal as output from the first transistor. The version of the second input signal as output from the third transistor is made to add to the amplified version of the first input signal as output from the first transistor, and the resulting sum is output onto a first differential output signal node of the LNA.

Due to the third transistor being biased in the sub-threshold region, the first cancel signal as output from the third transistor is approximately 180 degrees out of phase with respect to the first distortion signal as output from the first transistor. The first cancel signal as output from the third transistor is made to cancel at least a portion of the first distortion signal as output from the first transistor, thereby reducing the magnitude of distortion on the first differential output signal node of the amplifier. The fourth transistor that is biased in the sub-threshold region is coupled in a similar way to the way that the third transistor is coupled, except that the fourth transistor is coupled so that a second cancel signal it generates will cancel at least a part of the second distortion signal generated by the second transistor.

The sources of the first and second transistors are source degenerated by degeneration inductors. The inductances of the degeneration inductors, the DC bias voltages and currents at which the first, second, third and fourth transistors are biased, and the sizes of the first, second, third and fourth transistors may be set such that the phase and magnitude of the first cancel signal optimally cancels the first distortion signal and such that the phase and magnitude of the second cancel signal optimally cancels the second distortion signal.

Because the gates of the transistors used to generate the cancel signals (the third and fourth transistors) are not coupled to the differential input signal nodes of the LNA as in a conventional MDS LNA, the input capacitance of the novel differential MDS LNA is reduced. Noise introduced into the output of the novel differential MDS LNA due to transistors biased in the sub-threshold region is reduced because in the novel LNA topology, there are two stages. By placing a first amplification stage before the second stage having the noisy sub-threshold region biased transistors, the noise contribution of the sub-threshold region biased transistors to the overall circuit output is reduced.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 1 (Prior Art) is a diagram of a conventional differential active post-distortion LNA.

FIG. 2 (Prior Art) is a diagram of a conventional single-ended DS LNA.

FIG. 3 (Prior Art) is a diagram of a conventional single-ended MDS LNA.

DETAILED DESCRIPTION

Figure 4:
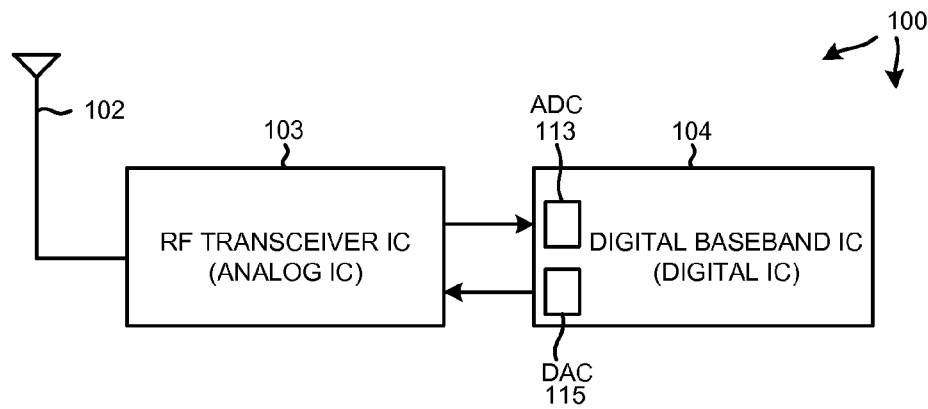
FIG. 4 a high level block diagram of one particular type of mobile communication device 100 in accordance with one novel aspect.

FIG. 4 is a very simplified high level block diagram of one particular type of mobile communication device 100 in accordance with one novel aspect. In this example, mobile communication device 100 is a 3-D cellular telephone that uses the CDMA2000 cellular telephone communication protocol. The cellular telephone includes (among several other parts not illustrated) an antenna 102 and two integrated circuits 103 and 104. Integrated circuit 104 is called a "digital baseband integrated circuit" or a "baseband processor integrated circuit". Integrated circuit 103 is an RF transceiver integrated circuit. RF transceiver integrated circuit 103 is called a "transceiver" because it includes a transmitter as well as a receiver.

Figure 5:
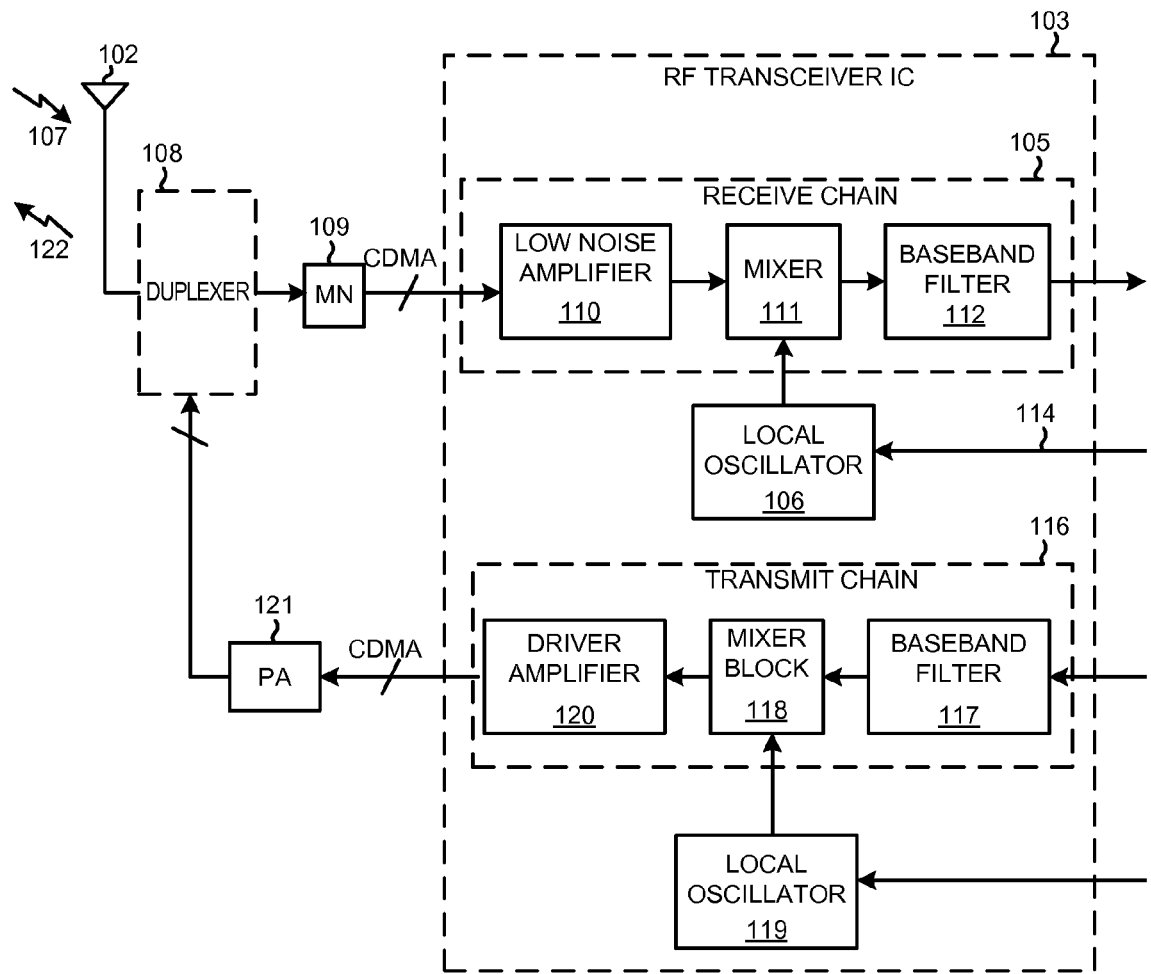
FIG. 5 is a more detailed block diagram of the RF transceiver integrated circuit 103 of FIG. 1.

FIG. 5 is a more detailed block diagram of the RF transceiver integrated circuit 103 of FIG. 1. The receiver includes what is called a "receive chain" 105 as well as a local oscillator (LO) 106. When the cellular telephone is receiving, a high frequency RF signal 107 is received on antenna 102. Information from signal 107 passes through duplexer 108, matching network 109, and through the receive chain 105. Signal 107 is amplified by low noise amplifier (LNA) 110 and is down-converted in frequency by mixer 111. The resulting down-converted signal is filtered by baseband filter 112 and is passed to the digital baseband integrated circuit 104. An analog-to-digital converter 113 in the digital baseband integrated circuit 104 converts the signal into digital form and the resulting digital information is processed by digital circuitry in the digital baseband integrated circuit 104. The digital baseband integrated circuit 104 tunes the receiver by controlling the frequency of the local oscillator signal (LO) 114 supplied by local oscillator 106 to mixer 111.

If the cellular telephone is transmitting, then information to be transmitted is converted into analog form by a digital-to-analog converter 115 in the digital baseband integrated circuit 104 and is supplied to a "transmit chain" 116. Baseband filter 117 filters out noise due to the digital-to-analog conversion process. Mixer block 118 under control of local oscillator 119 then up-converts the signal into a high frequency signal. Driver amplifier 120 and an external power amplifier 121 amplify the high frequency signal to drive antenna 102 so that a high frequency RF signal 122 is transmitted from antenna 102.

Figure 6:
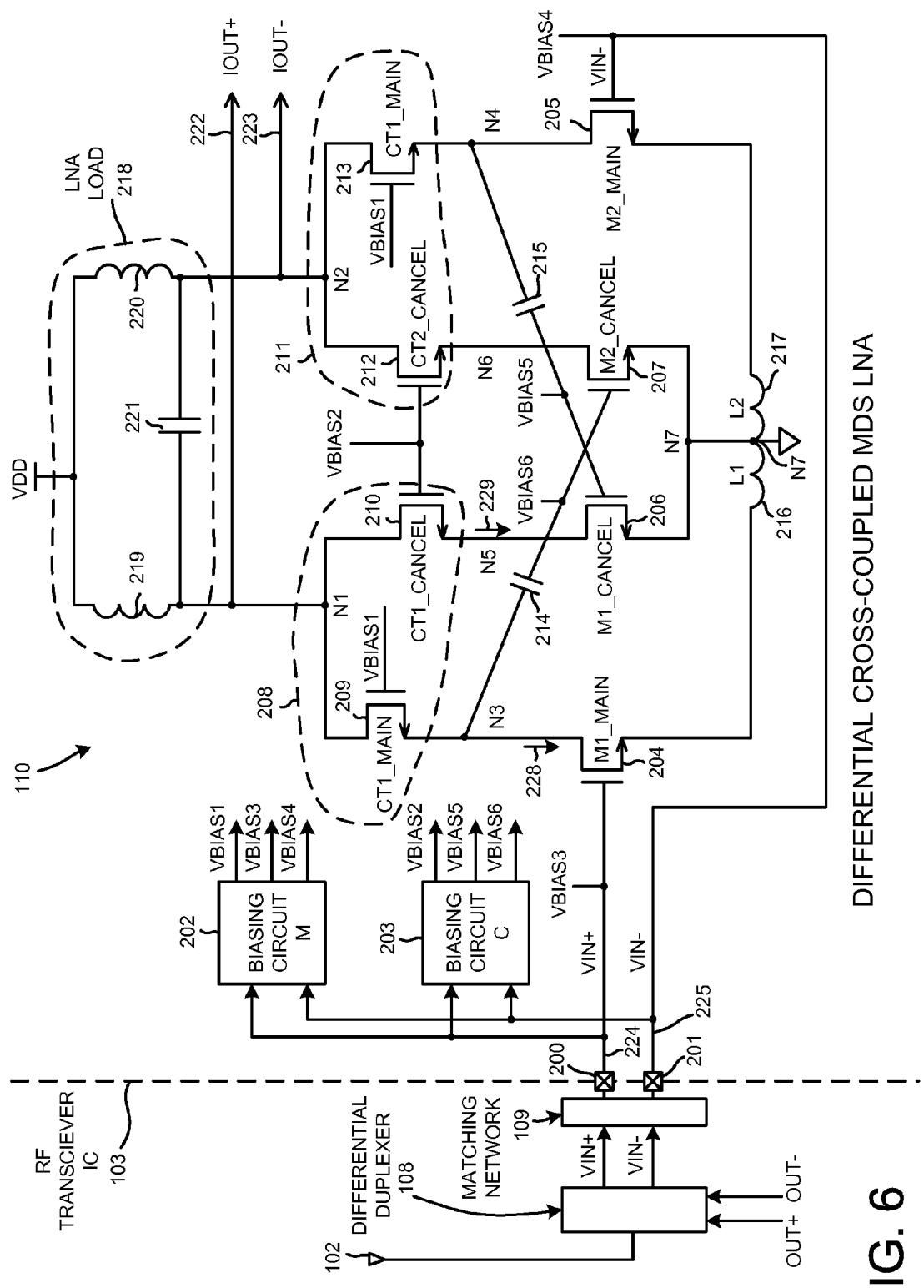
FIG. 6 is a circuit diagram of the novel LNA 110 of FIG. 5.

FIG. 6 is a circuit diagram that shows LNA 110 in further detail. LNA 110 includes two differential input signal terminals 200 and 201, a DC biasing circuit M 202, a DC biasing circuit C 203, an M1_main field effect transistor (FET) 204, an M2_main FET 205, an M1_cancel FET 206, an M2_cancel FET 207, a first cascode circuit 208 including two FETs 209 and 210, a second cascode circuit 211 including two FETs 212 and 213, two capacitors 214 and 215, a first degeneration inductor L1 216, a second degeneration inductor L2 217, an LNA load 218 including two inductors 219 and 220 and a capacitor 221, and two differential output signal nodes 222 and 223. All transistors 204-207, 209, 210, 212 and 213 are N-channel FETs. Inductors 216, 217, 219 and 220 and capacitors 214, 215 and 221 are integrated components formed on RF transceiver integrated circuit 103 using semiconductor fabrication processes.

Biasing circuit M 202 supplies a DC bias voltage VBIAS1 onto the gates of cascode FETs 209 and 213. Biasing circuit M 202 also supplies a DC bias voltage VBIAS3 onto the gate of main FET 204 and supplies a DC bias voltage VBIAS4 onto the gate of main FET 205 as illustrated. These bias voltages are set such that the main FETs 204 and 205 are biased in their saturation operating regions. Biasing circuit C 203 supplies a DC bias voltage VBIAS2 onto the gates of cascode FETs 210 and 212. Biasing circuit C 203 also supplies a DC bias voltage VBIAS5 onto the gate of cancel FET 206 and supplies a DC bias voltage VBIAS6 onto the gate of cancel FET 207. These bias voltages are set such that the cancel FETs 206 and 207 are biased in their sub-threshold operating regions. The sub-threshold operating region is sometimes referred to as the weak inversion operating region. Although in the example of FIG. 6 there are two bias voltages used to bias cascode transistors 209, 213, 210 and 212, in other embodiments the gates of all the cascode transistors are connected together and a single DC bias voltage is used to bias all the cascode transistors.

Figure 7:
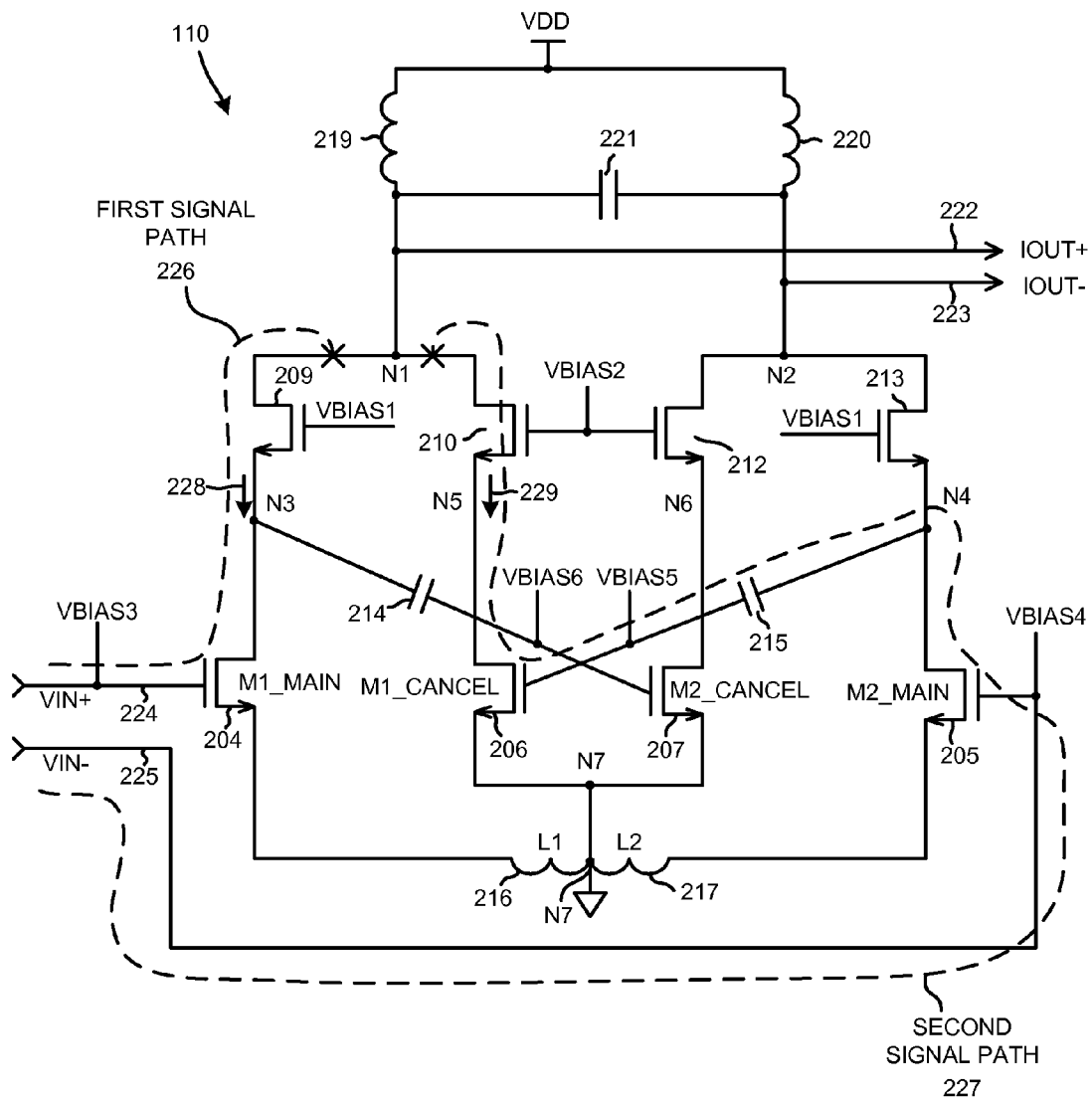
FIG. 7 illustrates an operation of the novel LNA circuit 110 of FIG. 6.
Figure 7A:
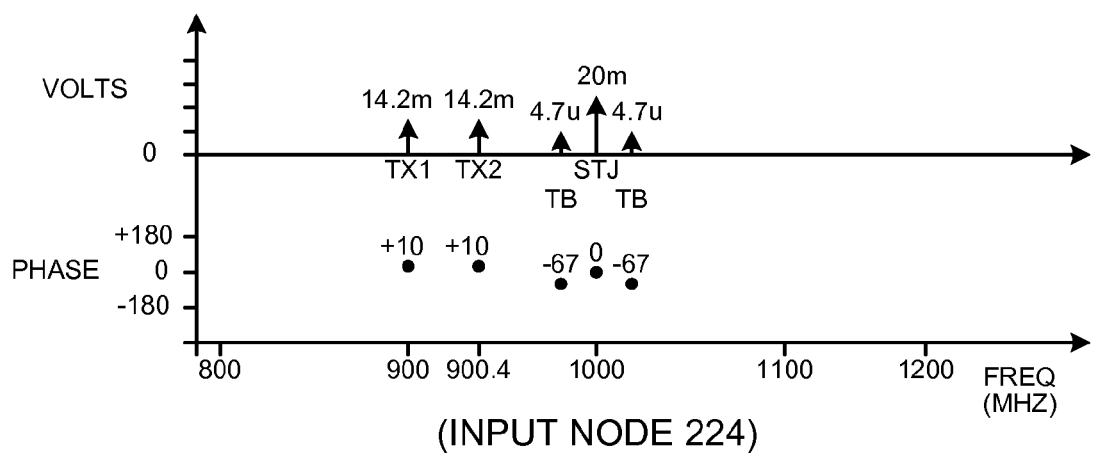
FIGS. 7A-7F are charts that set forth the magnitude and phase of signals present on various nodes in the novel LNA circuit 110 of FIG. 6.
Figure 7B:
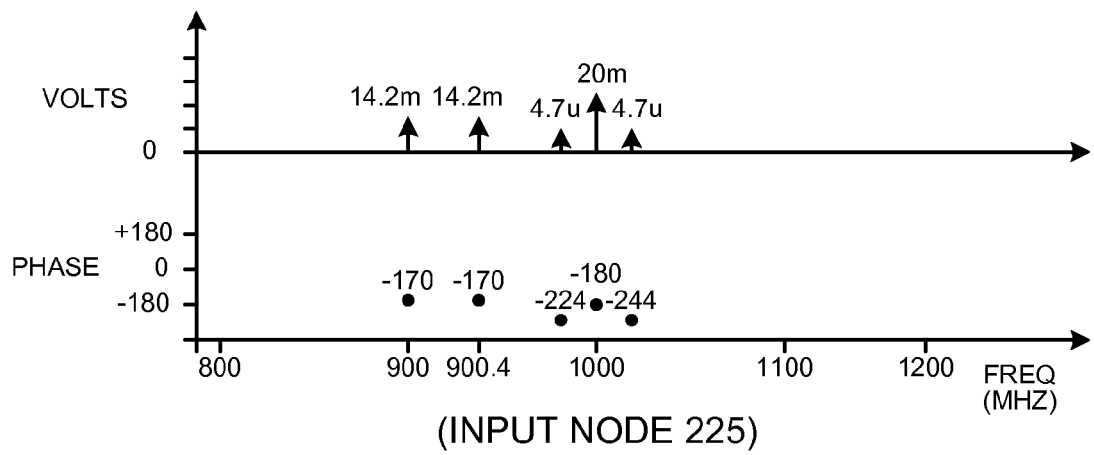
Figure 7C:
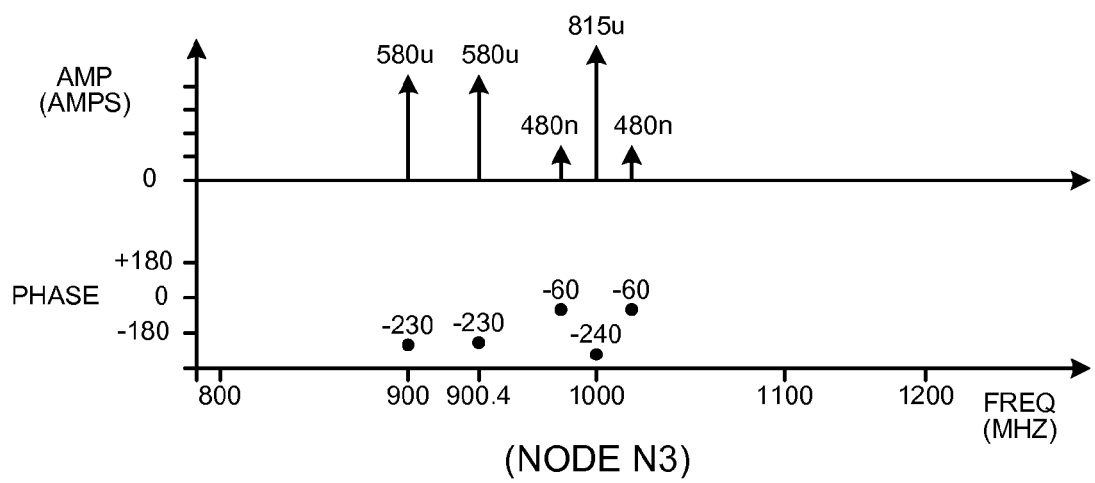
Figure 7D:
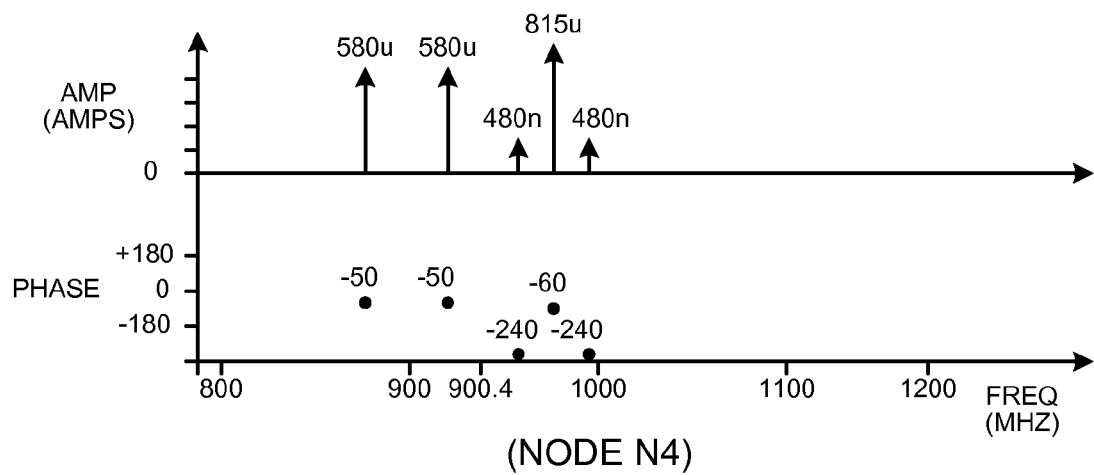
Figure 7E:
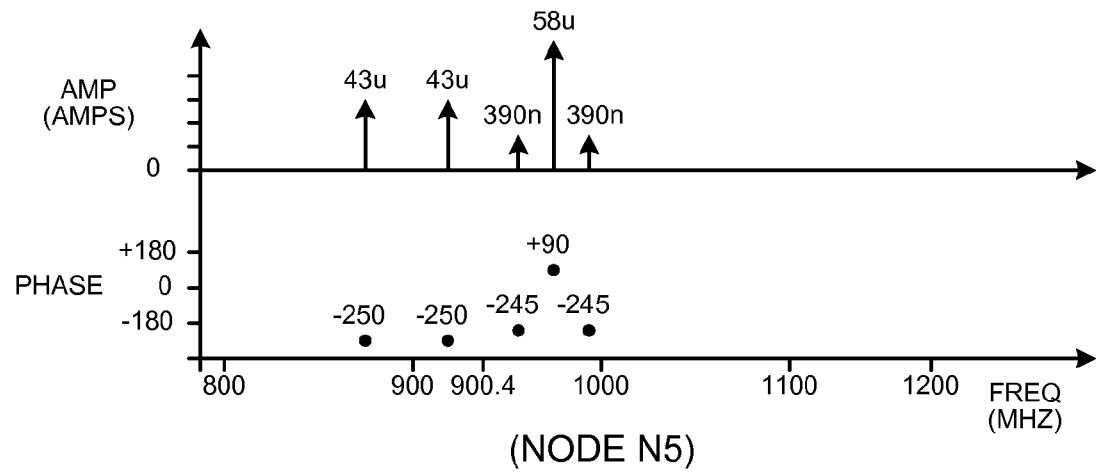
Figure 7F:
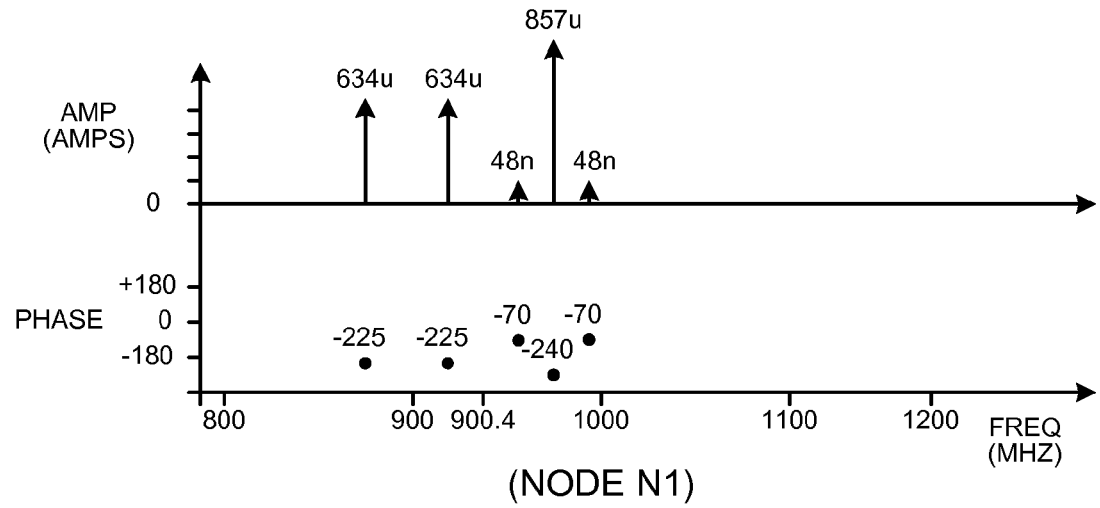

FIG. 7 illustrates an operation of the novel LNA circuit 110 of FIG. 6. The circuit is said to be differential in that it receives a differential input voltage signal on differential input signal nodes 224 and 225. A voltage input signal VIN+ is output by matching network 109 and is supplied onto terminal 200 and input node 224, whereas a voltage input signal VIN− is output by matching network 109 and is supplied onto terminal 201 and input node 225. For explanation purposes here, assume that the VIN+ input signal is a pure sinusoidal signal having a single frequency. This signal is also referred to as the desired input signal.

Transistor M1_main 204 is biased in its saturation region and is configured as a common source amplifier. An amplified version of the desired VIN+ input signal therefore appears on the drain of M1_main FET 204 at node N3. Due to non-linearities in M1_main FET 204, distortion signals including a third order distortion signal appears on node N3 along with the amplified version of the desired signal. The signals on node N3 are communicated through cascode FET 209 onto summing node N1 and output node 222. This signal path is referred to as first signal path 226. Arrow 228 in FIG. 7 represents the amplified version of the desired input signal VIN+ as well as the distortion signal generated due to non-linearities in M1_main transistor 204.

Degeneration inductor 216 reduces the gate-to-source voltage (Vgs) of M1_main FET 204. Because Vgs is smaller, M1_main operates over a smaller portion of its non-linear Vgs-to-Id transconductance curve. Because the M1_main transistor is operating over a smaller portion of its transconductance curve, the amplified output of M1_main FET 204 is more linear. The Vgs may, for example, be reduced by on the order of half of what it would be if inductor L1 were not present. The same improvement in linearity applies to the consequence of including inductor 217.

The approximate shift in phase of the version of the desired signal VIN+ on node N3 with respect to the phase of the desired VIN+ input signal on input node 224 is by Equation 3 below.

$$\Delta\Theta = 180 - \text{phase}\left(\frac{g_m}{1 + g_m j\omega L_{degen}}\right) \quad \text{(Equ. 3)}$$

The term Ldegen is the inductance of the first degeneration inductor 216 at the operating frequency. The term $g_m$ is a function of the magnitude of current flow through M1_main FET 204 and device size. The term $g_m$ can be changed by changing the bias voltage VBIAS3. If $g_m j\omega L_{degen}$ is much smaller than one, then in accordance with Equation 3 phase shift approaches 180 degrees. If $g_m j\omega L_{degen}$ is much larger than one, then in accordance with Equation 3 there is a phase shift of approximately ninety degrees. The phase shift of the version of the desired signal VIN+ and the third order distortion signal on node N3 can be adjusted by adjusting the bias voltages VBIAS3 and VBIAS1.

In addition to the first signal path 226 from input node 224 to node N1, there is a second signal path 227 from input node 225 to node N1. The VIN− input signal is present on input node 225. The VIN− input signal has the opposite the polarity from VIN+ signal present on input node 224. In other words, the phase of the signal VIN− is 180 out of phase with respect to signal VIN+. The input signal VIN− on input node 225 is supplied onto the gate of M2_main FET 205. The M2_main FET 205 is identical to the M1_main FET 204 in size and bias current and operating region. The desired VIN− input signal is therefore amplified by M2_main transistor 205 such that an amplified version of the VIN− input signal appears on the drain of M2_main FET 205 at node N4, along with distortion signals including a third order distortion signal. The phases of the amplified version of VIN− and the distortion signal on node N4 are 180 degrees out of phase with respect to the corresponding amplified version on VIN+ and the distortion signal on node N3. The signals on node N4 are communicated through capacitor 215 without any phase shift onto the gate of M1_cancel FET 206.

M1_cancel FET 206 is configured as a common source amplifier. The amplified version of the VIN− desired signal is therefore phase shifted by 180 degrees by the M1_cancel FET 206. This 180 degree phase shift adds to the 180 degree phase shift between the VIN− and VIN+ signals, such that the version of the desired signal on node N5 is in phase with the amplified version of the desired signal on node N3. The version of the desired signal on node N5 is communicated through cascode FET 210 onto the summing node N1.

Because the two versions of the desired signal on nodes N3 and N5 are in phase with one another, the two signals add and the resulting signal is output onto first differential output signal node 222.

The M1_cancel FET 206 is, however, biased in the sub-threshold region of operation. When the power expansion series of the transconductance equation of a FET biased in the sub-threshold region is compared to the power expansion series of the transconductance of a FET biased in the saturation region, it is recognized that the third order coefficients have opposite polarities. Accordingly, to a first approximation, the third order distortion signal supplied by the sub-threshold biased M1_cancel FET 206 onto node N5 is approximately 180 degrees out of phase with respect to the distortion signal on node N3. Arrow 229 in FIG. 7 represents this distortion signal that is generated by M1_cancel transistor 206. This distortion signal is also referred to as a first cancel signal. First cascode circuit 208 couples the cancel signal 229 on node N5 onto summing node N1, thereby canceling at least a portion of the third order distortion signal generated by M1_main FET 204.

The second M2_cancel transistor 207 operates in similar fashion to the way that the first M1_cancel transistor 206 operates, except that M2_cancel transistor 207 generates a second cancel signal that cancels at least a portion of a second distortion signal generated by M2_main transistor 205. The version of the desired signal as output by the M2_cancel transistor 207 is, however, in phase with the amplified version of the desired signal as output by the M2_main transistor 205. Second cascode circuit 211 combines the two versions of the desired signals together and supplies the resulting sum onto second differential output signal node 223.

When operation of LNA circuit 110 of FIG. 6 is examined in further detail, it is recognized that there is a continuum of operation between operating a transistor in the saturation region and operating the transistor in the sub-threshold region. A consequence of this continuum is that the amount of phase shift by which the third order distortion signal on node N5 is shifted by M1_cancel can be adjusted somewhat by changing the VBIAS2 and VBIAS5 bias voltages. The phase shift by which the third order distortion signal is shifted by M1_cancel may therefore not be exactly 180 degrees out of phase with respect to the phase of the desired signal as output by M1_cancel. Accordingly, for a given VBIAS2 and VBIAS5, the inductance of inductor 216 is set such that the phase of the third order distortion signal on node N5 is 180 degrees out of phase with respect to the third order distortion signal on node N3. Similarly, the inductance of inductor 217 is set such that the phase of the third order distortion signal on node N6 is 180 degrees out of phase with respect to the third order distortion signal on node N4.

In addition to using the inductances of inductors 216 and 217 to phase align the main and cancel signal path distortions, the main and cancel signals path distortions can also be aligned by adding a third inductor between the source of M1_cancel transistor 206 and ground node N7 and by adding a fourth inductor between the source of M2_cancel transistor 207 and ground node N7. This additional alignment technique is not used in the specific example of FIG. 6, however, because providing the third and fourth inductors consumes die area and minimizing the area of the LNA 110 was more important in the specific application than was providing the tuning flexibility afforded by adding the third and fourth inductors.

It is recognized that this description of operation of LNA 110 is a simplification and is therefore inaccurate in certain respects. In an actual realization of LNA 110, there will be many distortion components that may intermodulate and cross-modulate in different complex ways with different incoming signals and various jammers. The transconductance equations commonly employed to describe transistor operation in various operating regions are simplifications and are to some extent inaccurate, depending on how the various transistors of the LNA are biased and sized. Also, the textual labels commonly given to the various types of distortion signals and the characterizations of the relative phases between the various signals are generally only useful in a first level of analysis. In realizing an actual circuit, precise description of circuit operation is not possible and attempting it in either textual form or mathematical form is of limited utility. Rather, the circuit is fabricate and/or is simulated, and then adjustments to various circuit parameter values (VBIAS1-VBIAS6, the inductance of inductors 216 and 217, the size of transistors M1_main and M2_main, the size of transistors M1_cancel and M2_cancel, and the size of the cascode transistors) are made in various permutations until a set of values is empirically found that results in a satisfactory (preferably optimal) circuit operation in a given application.

FIGS. 7A-7F set forth, for each of several nodes in the novel LNA circuit 110 of FIG. 6, the spectral components present on the node and the phase of each spectral component. The data of FIGS. 7A-7F are for circuit parameters set forth in Table 1 below:

TABLE 1

| PARAMETER | VALUE |
| --- | --- |
| VBIAS1 (cascode main) | 1.130 Volts |
| VBIAS2 (cascode cancel) | 1.130 Volts |
| VBIAS3 (main +) | 0.559 Volts |
| VBIAS4 (main −) | 0.559 Volts |
| VBIAS5 (cancel +) | 0.416 Volts |
| VBIAS6 (cancel −) | 0.416 Volts |
| M1_MAIN SIZE | 384 Microns × 0.1 Microns |
| M1_MAIN DC CURRENT | 5.6 mA |
| M1_CANCEL SIZE | 120 Microns × 0.1 Microns |
| M1_CANCEL DC CURRENT | 0.230 mA |
| INDUCTOR L1 | 1.5 nH (differential) |
| CT1_MAIN SIZE | 120 Microns × 0.1 Microns |
| CT1_CANCEL SIZE | 96 Microns × 0.1 Microns |
| NOISE FIGURE | 1.6 dB |
| LNA transconductance | 40 mS |
| TRIPLE BEAT (TB) | 84 dB |
| IIP3 | 14 dBm |

There are several differences between the specific embodiments of FIG. 6 and the conventional single-ended MDS LNA illustrated in FIG. 3. First, in the conventional MDS circuit of FIG. 3, there are two transistor gates (the gates of transistors 16 and 19) that are coupled to input lead 20 of the LNA. The circuit of FIG. 3 therefore has an undesirably large input capacitance. In the novel LNA circuit of FIG. 6, on the other hand, the input capacitance of the LNA is reduced because the gates of cancel transistors 206 and 207 are not coupled to the input nodes 224 and 225. In the novel LNA of FIG. 6, the gate of only one transistor is coupled to each of the input nodes 224 and 225.

Second, the introduction of noise into the LNA output by cancel transistors biased in the sub-threshold region is reduced. In the conventional MDS circuit of FIG. 3, the sub-threshold biased transistor 16 is coupled in parallel with the main amplifying transistor 19. A transistor biased in the sub-threshold region typically generates more noise than a similar transistor biased in the saturation region. The sub-threshold biased transistor 16 therefore typically introduces an undesirably large amount of noise into the LNA output.

The novel LNA circuit of FIG. 6, on the other hand, involves two stages through which signals pass to generate the utilized cancel signals. The first stage involves the main transistors. The second stage involves the cancel transistors. In a two stage system, the gain of the first stage can be increased and gain of the second stage can be decreased while maintaining the same overall gain. Because the stage involving the sub-threshold biased transistors is preceded by a gain stage, the noise contribution of the sub-threshold biased transistors to the overall LNA noise figure is reduced.

Third, because the cancel transistors 206 and 207 are not source degenerated, the cancel transistors can be used to boost LNA gain in a current efficient manner in operating modes that do not require high linearity. Fourth, if the main cascode transistors 209 and 213 are sized properly, then the ratio Vin_cancel/Vin_main is larger than the ratio that results in a larger amount of desired distortion for the cancel transistors. Fifth, the topology of the novel LNA of FIG. 6 does not involve a tapped inductor. Inductor design and inductor modeling are therefore simplified.

Figure 8:
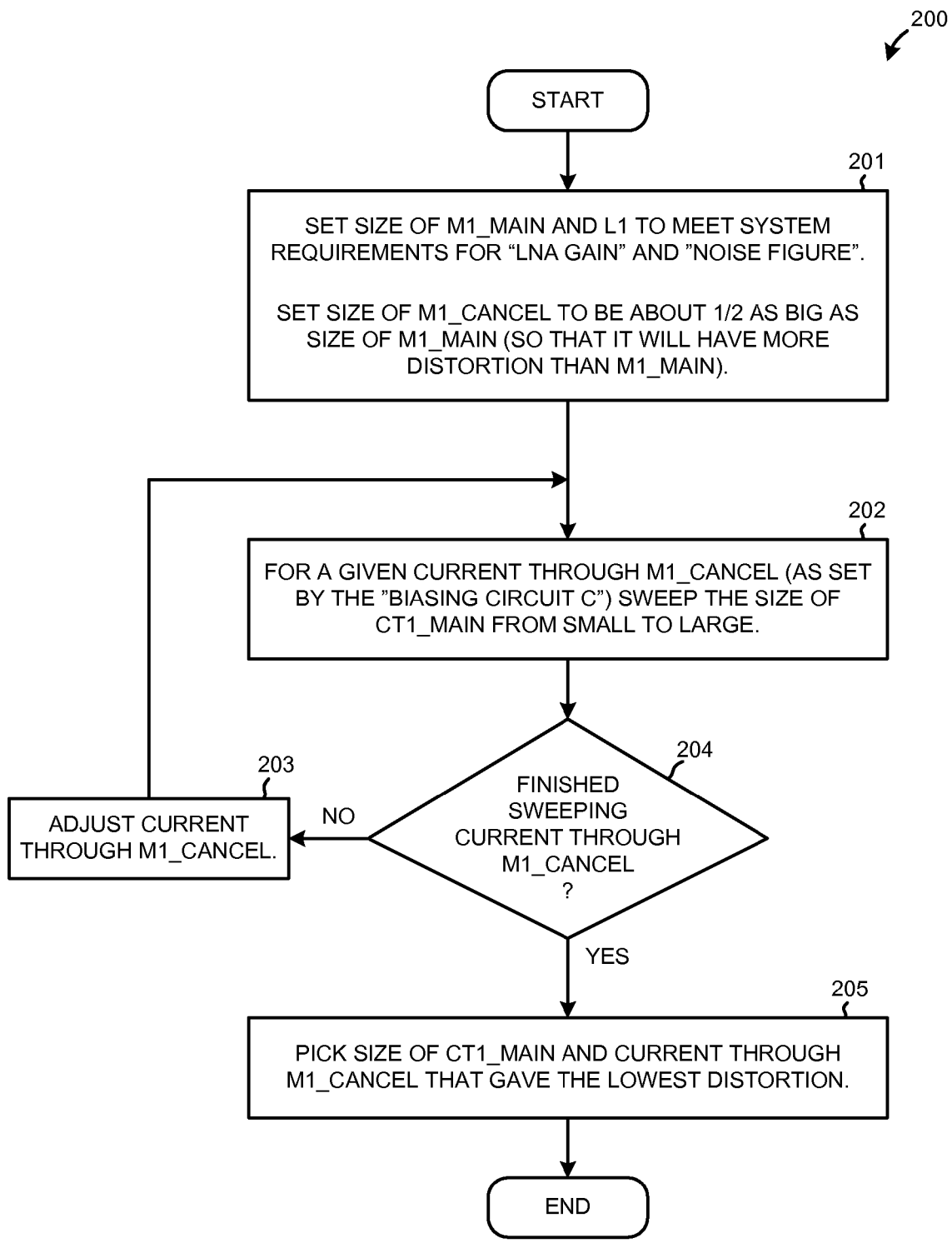
FIG. 8 is a flowchart of a method by which the bias voltages and currents and transistor sizes and inductor inductances may be set so that distortion cancellation in the circuit of FIG. 6 is optimized.

FIG. 8 is a flowchart of one suitable method 200 by which the various transistor sizes, inductor values, and DC bias currents and DC bias voltages can be set. First (step 201), the size of main transistors 204 and 205 is set to meet system requirements for LNA gain and noise figure. The size of cancel transistors 206 and 207 is set to be about one half as large as the size of main transistors 204 and 205 to reduce parasitics associated with the cancel transistors. Next (step 202), for a given DC bias current through cancel transistors 206 and 207 (as initially set by setting DC bias voltages VBIAS2, VBIAS5 and VBIAS6), the size of the cascode transistors CT1_main 209 and CT2_main 213 is swept from small to large. Circuit performance data, including distortion measurements are taken for each incremental change in size of the cascode transistors 209 and 213. After the sweep, the DC bias current through cancel transistors 206 and 207 is adjusted (step 203), and the size of the cascode transistors 209 and 213 is again swept from small to large. Circuit performance data is collected again. This process of sweeping the size of the cascode transistors from small to large is repeated for each different value of cancel transistor DC bias current. When the sweeping has been completed for all the various increments of cancel transistor DC bias current (step 204), then the size of the cascode transistors and the cancel transistor bias current are set (step 205) to have the values that resulted in the LNA having the best circuit performance for the particular application in which the LNA is to operate. As mentioned earlier, the inductance of the degeneration inductor can be part of the optimization.

Figure 9:
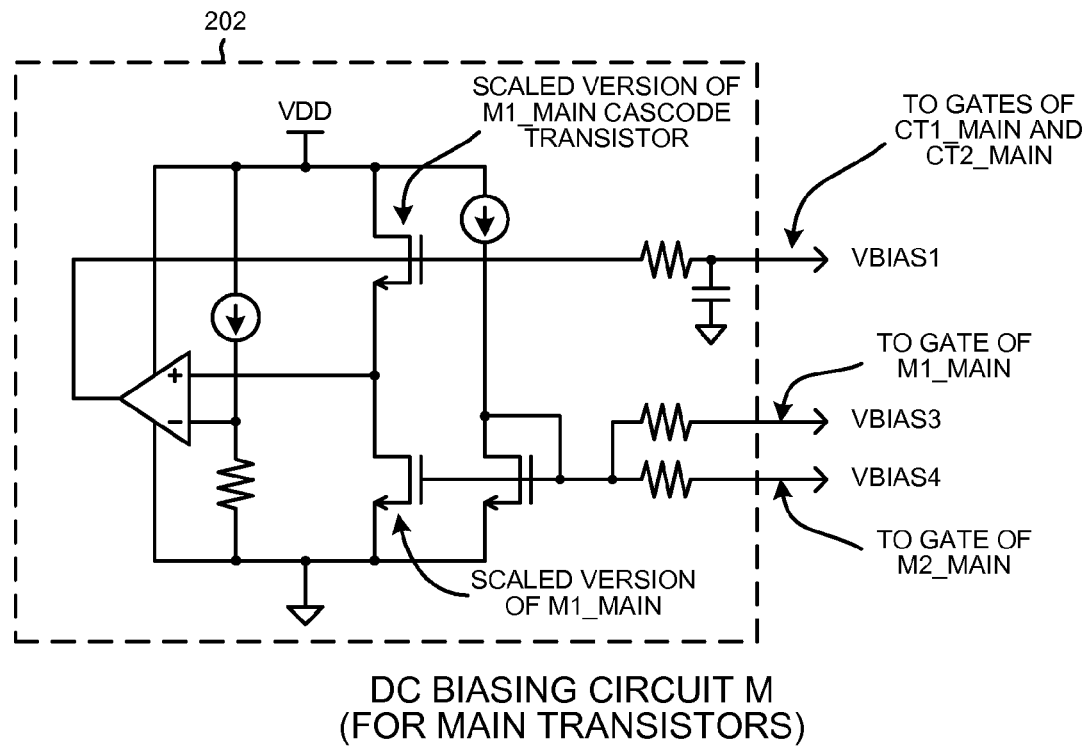
FIG. 9 is a more detailed diagram of the DC biasing circuit 202 of the novel LNA circuit 110 of FIG. 6.
Figure 10:
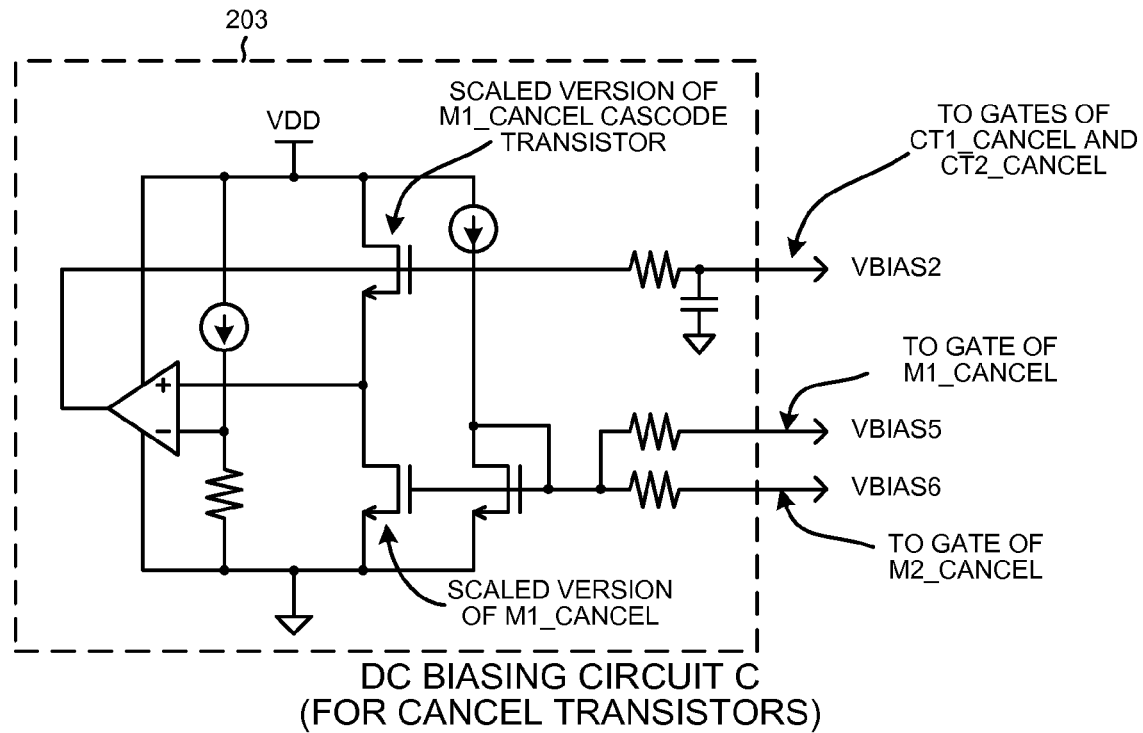
FIG. 10 is a more detailed diagram of the DC biasing circuit 203 of the novel LNA circuit 110 of FIG. 6.

FIG. 9 is a simplified circuit diagram of one possible way to realize DC biasing circuit M 202 of FIG. 6. FIG. 10 is a simplified circuit diagram of one possible way to realize DC biasing circuit C 203 of FIG. 6.

Figure 11:
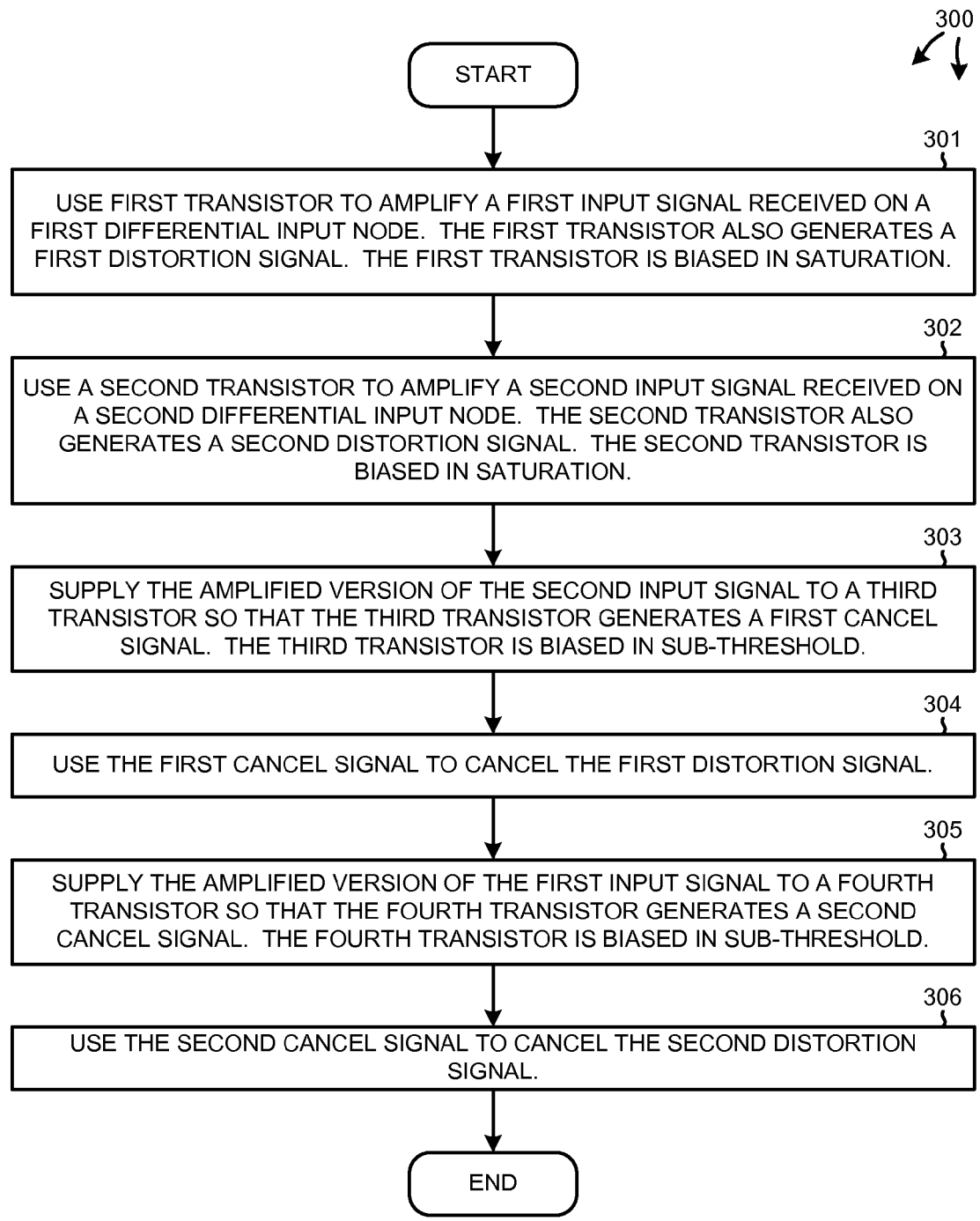
FIG. 11 is a simplified flowchart of a method 300 in accordance with one novel aspect.

FIG. 11 is a simplified flowchart diagram of a novel method 300. A first transistor is used (step 301) to amplify a first input signal received onto a first differential input node. In one example, the first transistor is the source degenerated M1_main transistor 204 of FIG. 6 and the first differential input node is node 224 of FIG. 6. The first transistor generates an amplified version of the first input signal as well as a first distortion signal. The first transistor is biased in the saturation region.

A second transistor is used (step 302) to amplify a second input signal received onto a second differential input node. In one example, the second transistor is source degenerated M2_main transistor 205 of FIG. 6 and the second differential input node is node 225 of FIG. 6. The second transistor generates an amplified version of the second input signal as well as a second distortion signal. The second transistor is biased in the saturation region.

The second input signal is approximately 180 degrees out of phase with the respect to the first input signal, and the first and second input signals together are a differential input signal that is supplied onto the differential input nodes of an LNA of which the first and second transistor are a part.

The amplified version of the second input signal is supplied (step 303) to a third transistor so that the third transistor generates a first cancel signal. In one example, the third transistor is M1_cancel transistor 206 of FIG. 6. The third transistor is biased in the sub-threshold region.

The first cancel signal is then used (step 304) to cancel at least a part of the first distortion signal. In one example, the first cancel signal is supplied via a first cascode circuit onto a first summing node and the first distortion signal is supplied via the first cascode circuit onto the first summing node. The first cancel signal cancels the first distortion signal on the first summing node. In one example, the first summing node is the first differential output node 222 of FIG. 6.

The amplified version of the first input signal is supplied (step 305) to a fourth transistor so that the fourth transistor generates a second cancel signal. In one example, the fourth transistor is M2_cancel transistor 207 of FIG. 6. The fourth transistor is biased in the sub-threshold region.

The second cancel signal is then used (step 306) to cancel at least a part of the second distortion signal. In one example, the second cancel signal is supplied via a second cascode circuit onto a second summing node and the second distortion signal is supplied via the second cascode circuit onto the second summing node. The second cancel signal cancels the second distortion signal on the second summing node. In one example, the second summing node is second differential output node 223 in FIG. 6.

Although certain specific embodiments are described above for instructional purposes, the teachings of this patent document have general applicability and are not limited to the specific embodiments described above. For example, distortion signals from transistors 206 and 204 may be made to cancel by omitting transistor 210 and connecting the drain of M1_cancel transistor 206 directly to the drain of the M1_main transistor. Similarly, transistor 212 may be omitted and the drain of M2_cancel transistor 207 may be made to be directly connected to the drain of M1_main transistor 205.

Figure 12:
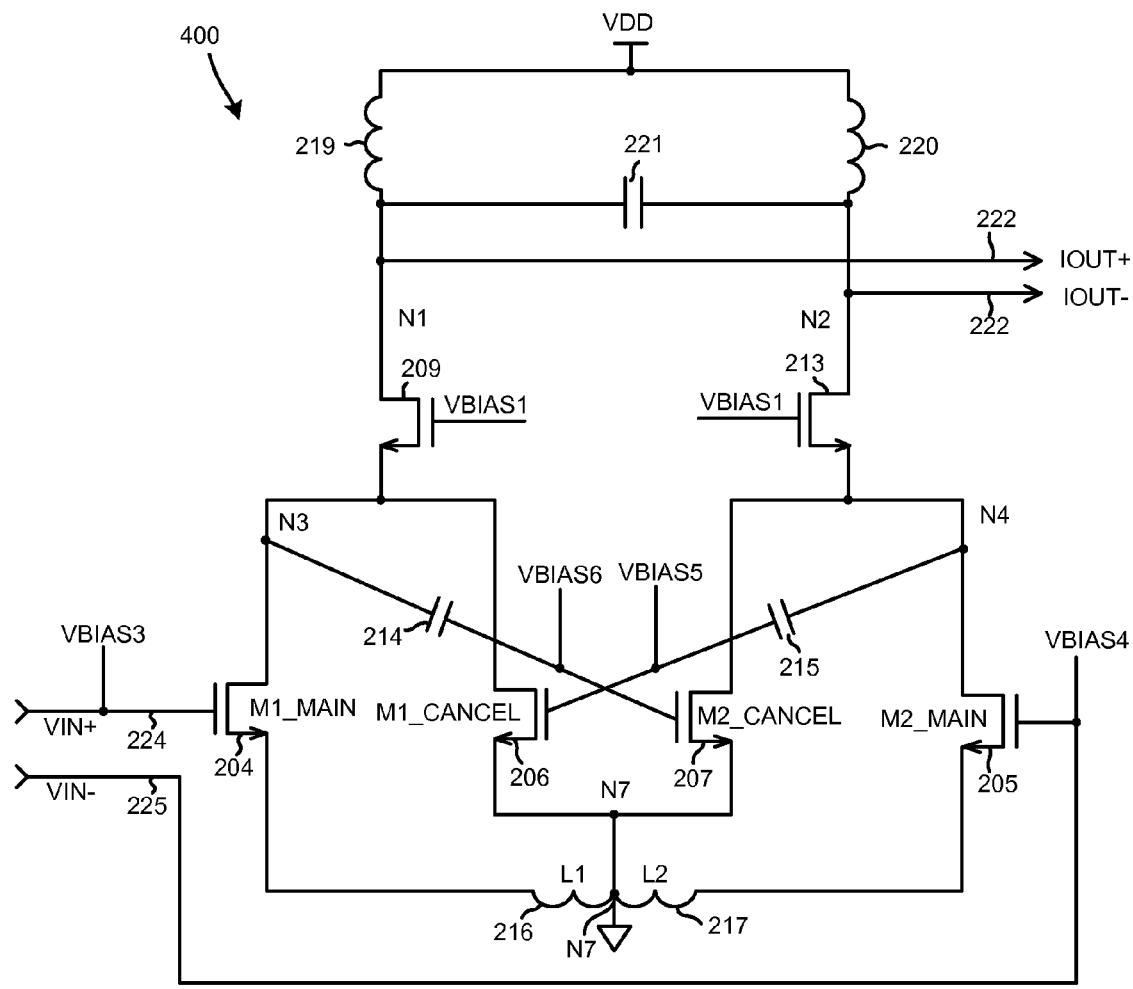
FIG. 12 is a circuit diagram of a first variant 400 of the novel LNA topology set forth in FIG. 6.

FIG. 12 is a circuit diagram of this first variant 400 of the novel LNA topology. Ideally, the cascode transistors in the signal path of the main transistors 204 and 205 do not introduce significant noise. Unfortunately, in a real circuit, these cascode transistors do contribute significantly to noise. The reason is that there is a finite impedance at the operating frequency that is seen at the source of each cascode transistor (209 and 213 of FIG. 12). For each of these cascode transistors, the impedance seen as its source is determined by the output impedance (and capacitance) of the associated main transistor and also the input impedance of the associated cancel transistor (mostly gate-to-source capacitance). In the circuit of FIG. 12, the drain of cancel transistor 206 is connected to the source of cascode transistor 209. This reduces the impedance seen by the source of cascode transistor 209. The lower this impedance, the larger is the cascode transistor's contribution to noise figure (and the smaller is the gain of the LNA). The LNA 110 of FIG. 6, on the other hand, includes a second cascode transistor 210 that prevents the reduction in impedance seen by the source of cascode transistor 209. In the circuit of FIG. 6, the noise contribution of cancel transistor 210 is cut by the gain of both M1_main transistor 204 and M1_cancel transistor 210. In the case of the circuit of FIG. 12, the noise contribution of cancel transistor 206 is only cut by the gain of M1_main transistor 204.

The circuit of FIG. 12 also differs from the circuit of FIG. 6 in that in the circuit of FIG. 6 there is a significant voltage swing at the source of cascode transistor 209 in order for M1_cancel transistor 206 to generate enough distortion. As set forth above in connection with the method of FIG. 8, the size of M1_main transistor 204 may be used as one of the tuning elements to achieve linearization. Accordingly, lowering the impedance at node N3 makes it more difficult to set the proper voltage swing on node N3. Also, for the circuit of FIG. 12, the voltage swing appears between the drain and source of M1_cancel transistor 206, and that voltage swing may excite additional non-linearlity distortion components related to the drain-to-source voltage (Vds) of M1_cancel transistor 206.

Figure 13:
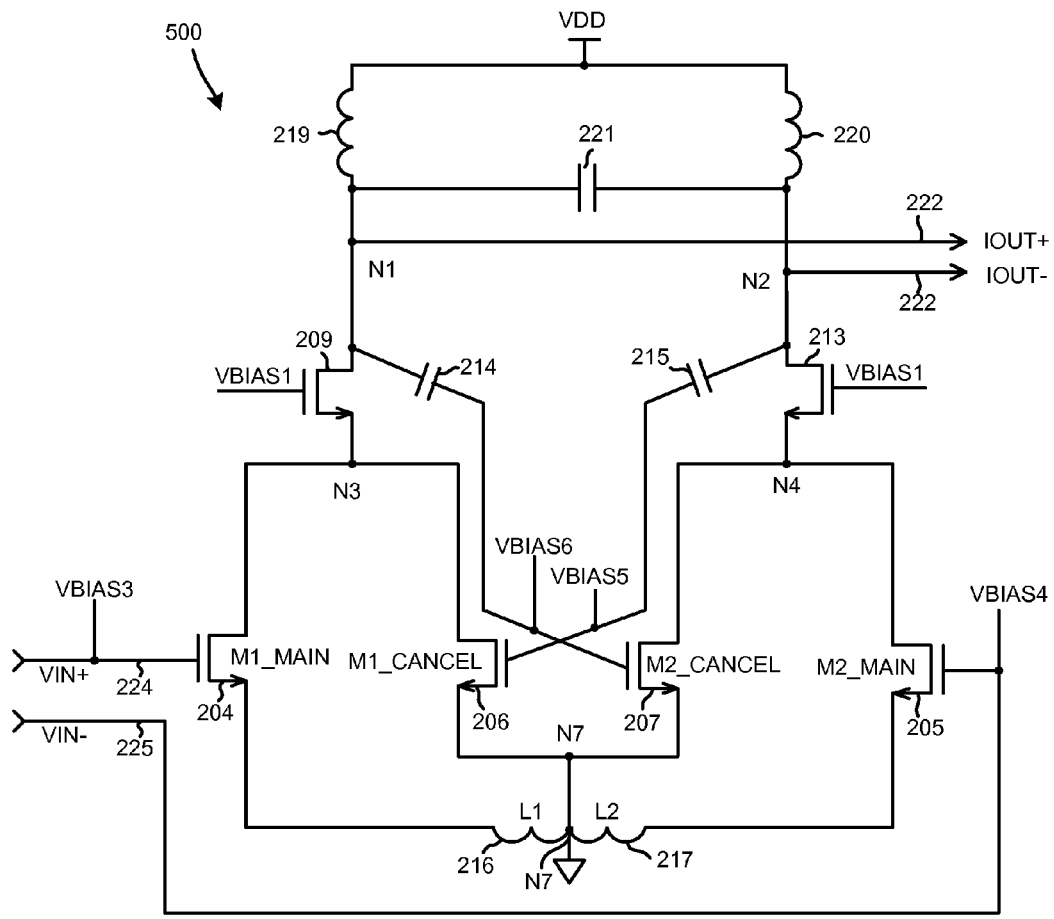
FIG. 13 is a circuit diagram of a second variant 500 of the novel LNA topology set forth in FIG. 6.

FIG. 13 is a circuit diagram of a second variant 500 of the novel LNA topology. In the circuit of FIG. 13, in addition to omitting cascode transistors 210 and 212 of the circuit of FIG. 6, the connection of capacitor 214 is changed so that in the circuit of FIG. 13 capacitor 214 AC couples the drain of cascode transistor 209 to the gate of M2_cancel transistor 207, and the connection of capacitor 215 is changed so that capacitor 215 AC couples the drain of cascode transistor 213 to the gate of M1_cancel transistor 206. Accordingly, various modifications, adaptations, and combinations of the various features of the described specific embodiments can be practiced without departing from the scope of the claims that are set forth below.

What is claimed is:

1. An amplifier having a first differential input node and a second differential input node, the amplifier comprising:
   a first transistor biased in a saturation region, wherein a gate of the first transistor is coupled to the first differential input node;
   a second transistor biased in the saturation region, wherein a gate of the second transistor is coupled to the second differential input node;
   a third transistor biased in a sub-threshold region, the third transistor having a gate that is capacitively coupled to a drain of the second transistor, wherein a first cancel signal on a drain of the third transistor cancels at least a part of a first distortion signal generated by the first transistor; and
   a fourth transistor biased in the sub-threshold region, the fourth transistor having a gate that is capacitively coupled to a drain of the first transistor, wherein a second cancel signal on a drain of the fourth transistor cancels at least a part of a second distortion signal generated by the second transistor.

2. The amplifier of claim 1, further comprising:
   a first cascode circuit that couples the drain of the first transistor to a first differential output node and that couples a drain of the third transistor to the first differential output node; and
   a second cascode circuit that couples the drain of the second transistor to a second differential output node and that couples a drain of the fourth transistor to the second differential output node.

3. The amplifier of claim 1, wherein the drain of the first transistor is directly connected to the drain of the third transistor, and wherein the drain of the second transistor is directly connected to the drain of the fourth transistor.

4. The amplifier of claim 2, further comprising:
   a first inductor having a first lead and a second lead, the first lead being coupled to a source of the first transistor, the second lead being coupled to a common node; and
   a second inductor having a first lead and a second lead, the first lead being coupled to a source of the second transistor, the second lead being coupled to the common node.

5. The amplifier of claim 4, wherein a source of the third transistor is coupled to the common node, and wherein a source of the fourth transistor is coupled to the common node.

6. The amplifier of claim 4, wherein the first cascode circuit comprises:
   a fifth transistor having a source and a drain, the source of the fifth transistor being coupled to the drain of the first transistor, the drain of the fifth transistor being coupled to the first differential output node; and
   a sixth transistor having a source and a drain, the source of the sixth transistor being coupled to the drain of the third transistor, the drain of the sixth transistor being coupled to the first differential output node.

7. The amplifier of claim 6, wherein a gate of the first transistor is biased at a first bias voltage, and wherein a gate of the third transistor is biased at a second bias voltage.

8. The amplifier of claim 7, wherein the first transistor is substantially larger than the third transistor, and wherein the second transistor is substantially larger than the fourth transistor.

9. An amplifier having a first differential input node, a second differential input node, a first differential output node, and a second differential output node, the amplifier comprising:
   a first transistor biased in a saturation region, wherein a gate of the first transistor is coupled to the first differential input node;
   a second transistor biased in the saturation region, wherein a gate of the second transistor is coupled to the second differential input node;
   a third transistor biased in a sub-threshold region, wherein a first cancel signal on a drain of the third transistor cancels at least a portion of a first distortion signal generated by the first transistor;
   a fourth transistor biased in the sub-threshold region, wherein a second cancel signal on a drain of the fourth transistor cancels at least a portion of a second distortion signal generated by the second transistor;
   a fifth transistor having a source and a drain, wherein the source of the fifth transistor is coupled to a drain of the first transistor, and wherein the drain of the fifth transistor is coupled to the first differential output node and is also capacitively coupled to a gate of the fourth transistor; and
   a sixth transistor having a source and a drain, wherein the source of the sixth transistor is coupled to a drain of the second transistor, and wherein the drain of the sixth transistor is coupled to the second differential output node and is also capacitively coupled to a gate of the third transistor.

10. The amplifier of claim 9, further comprising:
    a first inductor having a first lead and a second lead, the first lead being coupled to a source of the first transistor, the second lead being coupled to a ground node; and
    a second inductor having a first lead and a second lead, the first lead being coupled to a source of the second transistor, the second lead being coupled to the ground node.

11. The amplifier of claim 10, wherein a source of the third transistor is coupled to the ground node, and wherein a source of the fourth transistor is coupled to a ground node.

12. A method comprising:
    (a) using a first transistor biased in a saturation region to amplify a first input signal received on a first differential input node and to generate an amplified version of the first input signal, wherein the first transistor also generates a first distortion signal;

(b) using a second transistor biased in the saturation region to amplify a second input signal received on a second differential input node and to generate an amplified version of the second input signal, wherein the second transistor also generates a second distortion signal;

(c) supplying the amplified version of the second input signal to a third transistor so that the third transistor generates a first cancel signal, wherein the third transistor is biased in a sub-threshold region;

(d) using the first cancel signal to cancel at least a part of the first distortion signal;

(e) supplying the amplified version of the first input signal to a fourth transistor so that the fourth transistor generates a second cancel signal, wherein the fourth transistor is biased in the sub-threshold region; and (f) using the second cancel signal to cancel at least a part of the second distortion signal.

13. The method of claim 12, wherein (c) involves communicating the amplified version of the second input signal from a drain of the second transistor, through a first capacitor and onto a gate of the third transistor, and wherein (e) involves communicating the amplified version of the first input signal from a drain of the first transistor, through a second capacitor and onto a gate of the fourth transistor.

14. The method of claim 12, wherein the first input signal and the second input signal together are a differential input signal, and wherein the second input signal is approximately 180 degrees out of phase with respect to the first input signal.

15. The method of claim 12, wherein (d) involves using a first cascode circuit to communicate the first distortion signal from a drain of the first transistor to a first summing node, and using the first cascode circuit to communicate the first cancel signal from a drain of the third transistor to the first summing node, and wherein (f) involves using a second cascode circuit to communicate the second distortion signal from a drain of the second transistor to a second summing node, and using the second cascode circuit to communicate the second cancel signal from a drain of the fourth transistor to the second summing node.

16. The method of claim 12, wherein a drain of the first transistor is directly connected to a drain of the third transistor, and wherein a drain of the second transistor is directly connected to a drain of the fourth transistor.

17. An amplifier comprising:
a first amplifier circuit that receives a first input signal from a first differential input signal node and generates an amplified version of the first input signal and also generates a first distortion signal, wherein the first amplifier circuit comprises a first source degeneration inductor and a first transistor that is biased in the saturation region;
a second amplifier circuit that receives a second input signal from a second differential input signal node and generates an amplified version of the second input signal and also generates a second distortion signal, wherein the second amplifier circuit comprises a second source degeneration inductor and a second transistor that is biased in the saturation region;
first means for receiving the amplified version of the second input signal and generating a first cancel signal, and for using the first cancel signal to cancel at least a part of the first distortion signal; and
second means for receiving the amplified version of the first input signal and generating a second cancel signal, and for using the second cancel signal to cancel at least a part of the second distortion signal.

18. The amplifier of claim 17, wherein the first means involves a first transistor biased in a sub-threshold region, and wherein the second means involves a second transistor biased in the sub-threshold region.

19. The amplifier of claim 18, wherein the first means further comprises a first cascode circuit, and wherein the second means further comprises a second cascode circuit.

* * * * *